United States Patent
Estrada et al.

(10) Patent No.: US 7,096,649 B2
(45) Date of Patent: Aug. 29, 2006

(54) METHOD AND APPARATUS FOR INTEGRATED CIRCUIT STORAGE TUBE RETENTION PIN REMOVAL AND INSERTION

(75) Inventors: Jose Luis Estrada, Aguascalientes (MX); Omar Carlin, Aguascalientes (MX)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/911,143

(22) Filed: Aug. 4, 2004

(65) Prior Publication Data

US 2005/0011165 A1    Jan. 20, 2005

Related U.S. Application Data

(62) Division of application No. 10/190,907, filed on Jul. 8, 2002, now Pat. No. 6,796,023.

(51) Int. Cl.
*B65B 43/26* (2006.01)
(52) U.S. Cl. .................. 53/468; 53/473; 414/810; 29/762
(58) Field of Classification Search ................ 221/197, 221/278; 414/403, 810; 29/832, 762; 53/473, 53/468
See application file for complete search history.

(56) References Cited

U.S. PATENT DOCUMENTS

| | | | | |
|---|---|---|---|---|
| 4,207,665 | A | | 6/1980 | Kurek .......................... 29/270 |
| 4,295,258 | A | | 10/1981 | Penn et al. .................... 29/283 |
| 4,620,366 | A | | 11/1986 | Koon .......................... 29/762 |
| 4,629,387 | A | * | 12/1986 | Stillman et al. ............. 414/404 |
| 4,645,402 | A | | 2/1987 | Gunderson ................... 414/224 |
| 4,648,773 | A | * | 3/1987 | Bieganski ..................... 414/411 |
| 4,764,079 | A | * | 8/1988 | Linker et al. ................ 414/411 |
| 4,775,279 | A | * | 10/1988 | Linker ......................... 414/411 |
| 4,802,325 | A | | 2/1989 | Duncan ........................ 53/444 |
| 4,878,801 | A | * | 11/1989 | Pearson ....................... 414/411 |
| 4,941,795 | A | | 7/1990 | Elliott et al. ................. 414/403 |
| 5,594,985 | A | * | 1/1997 | Varley ......................... 221/197 |
| 6,272,739 | B1 | * | 8/2001 | Kimmel ....................... 29/764 |
| 6,609,701 | B1 | * | 8/2003 | Kanjanavikat ............... 29/270 |

* cited by examiner

*Primary Examiner*—Louis Huynh
(74) *Attorney, Agent, or Firm*—Yingsheng Tung; Wade James Brady, III; Frederick J. Telecky, Jr.

(57) ABSTRACT

While the manufacturing of integrated circuits (IC) has become a mostly automated process, the loading of the ICs into storage and shipping tubes 105 still requires a large amount of human interaction. A major stumbling block to the automation is the removal and insertion of retention pins 115 in the tubes. The present invention uses pressurized air 406 to hold a partially extracted retention pin 115 in position while the tube 105 is loaded. Once loaded, the retention pin 115 is reinserted. By not fully extracting the retention pin 115, alignment is maintained, simplifying the reinsertion step.

14 Claims, 4 Drawing Sheets

METHOD AND APPARATUS FOR INTEGRATED CIRCUIT STORAGE TUBE RETENTION PIN REMOVAL AND INSERTION

This is a divisional application of U.S. application Ser. No. 10/190,907 filed Jul. 8, 2002, now U.S. Pat. No. 6,796,023, which is incorporated herein by reference in its entirety.

FIELD OF THE INVENTION

This invention relates generally to integrated circuit manufacturing and specifically to packaging packaged integrated circuits in storage tubes.

BACKGROUND OF THE INVENTION

The manufacturing of integrated circuits (ICs) is a very highly researched area and as a result, has become a very efficient and automated process with relatively little human interaction. This automation has led to lower costs for the manufacturer and better quality products for the consumer. Automation results in lower costs because machines typically work faster and with fewer errors when compared to humans. Additionally, machines can work longer and with fewer needed breaks.

Unfortunately, not all tasks involved in the manufacturing process have been amenable to being automated. For example, once the ICs have been packaged and tested, the ICs are commonly placed into plastic tubes for storage and shipping purposes. Machines have been designed to perform such packing operations, but they tend to be complex and are slow and sensitive to becoming misaligned. Human packing of the ICs, on the other hand, is tedious and slow. Finally, combining humans and large machinery can lead to serious operator injuries.

One proposed solution involves the combination of both machines and humans. The human operators load the plastic tubes into the machines and the machines, through large pinchers, remove a pin used to hold the ICs in the plastic tubes. The pin is sometimes referred to as a retention pin. With the pin removed, the ICs are loaded into the plastic tubes and the machine replaces the pin. Once the pin is replaced, the human operator removes the plastic tubes filled with ICs. The pinchers used to remove the pins are large pneumatic mechanisms that tend to become misaligned quite easily, resulting in incorrect re-placement of the pins and possible damage to the plastic tubes and the ICs. Whenever a problem arises, the machine has to be shut down and the problem cleared through human intervention. This can greatly reduce the efficiency of the entire process. Additionally, the large size of the pneumatic pinchers poses a real danger to the human operators when the operators are loading and removing the plastic tubes from the machines.

A need has therefore arisen for machinery that can maximize automation of the IC packing process and at the same time minimize the threat of physical injury to their human operators.

SUMMARY OF THE INVENTION

In one aspect, the present invention provides a method for loading integrated circuits (IC) into a tube comprising the steps of moving a first ram to partially push out a retention pin located at one end of the tube, moving the retention pin to a second position, holding the retention pin in the second position, inserting a desired number of ICs into the tube, and moving a second ram to push the retention pin back into the tube.

In another aspect, the present invention provides a method for removing and inserting a retention pin in a tube comprising the steps of moving a first ram to partially push out a retention pin located at one end of the tube, moving the retention pin to a second position, holding the retention pin in the second position, moving a second ram to push the retention pin back into the tube.

In yet another aspect, the present invention provides a device comprising an air inlet to provide a pressurized flow of air, an air chamber coupled to the air inlet, the air chamber to allow the pressurized flow of air to move a retention pin, a first ram arranged at one side of the air chamber and movable along one axis, the first ram to partially push out the retention pin located at one end of a tube and into the air chamber, and a second ram arranged on an opposite side of the air chamber with respect to the first ram and movable along one axis, the second ram to push the retention pin back into the tube.

The present invention provides a number of advantages. For example, use of a preferred embodiment of the present invention minimizes human involvement in the packing of ICs into plastic storage and shipping tubes. This increases efficiency and minimizes costs.

Also, use of a preferred embodiment of the present invention permits ready retrofitting of IC packing machinery, minimizing the required investment of the IC manufacturer in new IC packing machinery.

Additionally, use of a preferred embodiment of the present invention allows a human operator to control a larger number of packing machines, increasing the efficiency of the human operator and decreasing operation costs.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

The making and use of the various embodiments are discussed below in detail. However, it should be appreciated that the present invention provides many applicable inventive concepts, which can be embodied in a wide variety of specific contexts. The specific embodiments discussed are merely illustrative of specific ways to make and use the invention, and do not limit the scope of the invention.

The discussion of a preferred embodiment of the present invention will focus on the removal and replacement of retention pins in the process of inserting plastic dual-in-line package (PDIP) packaged integrated circuits (IC) into plastic shipping and storage tubes. However, preferred embodiments of the present invention have applicability to the process of inserting other types of integrated circuit packaging into storage and shipping tubes as well. Examples of such packages include small outline integrated circuit (SOIC) packages, power flex packages, and any other type of packaging that uses plastic tubes and retention pins at the tube's ends to hold the units inside the tube. Therefore, the present invention should not be constructed as being limited to PDIP packages.

Figure 1A:
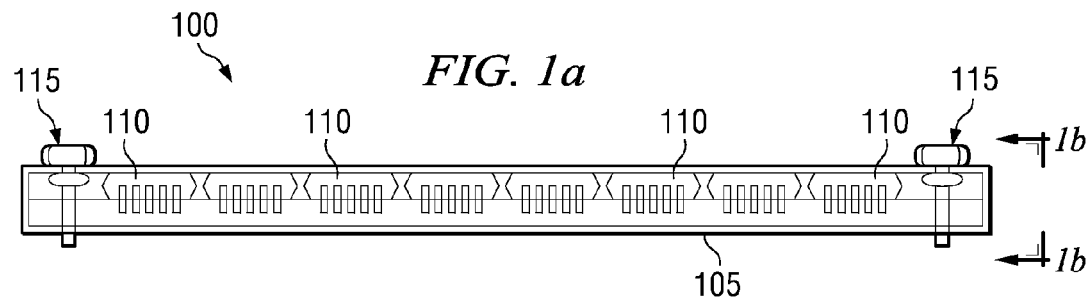
FIGS. 1a and 1b illustrate plan and side views of a plastic storage and shipping tube, complete with packaged integrated circuit chips and pins at either end of the plastic tube to prevent loss of the packed chips.
Figure 1B:
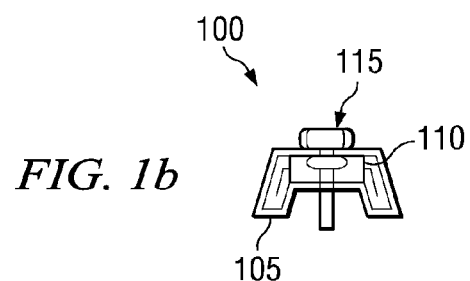

Referring now to FIGS. 1a and 1b, the diagrams illustrate front and side views of a plastic shipping and storage tube (plastic tube) 105 filled with PDIP packaged ICs 110. The plastic tube 105 is displayed as being clear in color, although there is no restriction on the color of the plastic tube 105. The ICs 110 are held inside the plastic tube 105 by several pins 115, usually, one pin at each end of the plastic tube 105. Preferably, the pin 115 or pins may be removed at one end of the plastic tube 105 so that the ICs 110 can be placed into (or removed from) the plastic tube 105. Typically, the plastic tube 105 has several pre-formed holes along its length to accept the pins 115. The idea behind the holes being placed at various points along the plastic tube 105 is to allow the pins 115 to be placed at different points along the plastic tube 105 so that the plastic tube 105 can securely hold a variable number of ICs 110 and/or ICs of different size without an excessive amount of movement in the ICs 110 once they are in the plastic tube 105.

Figure 2A:
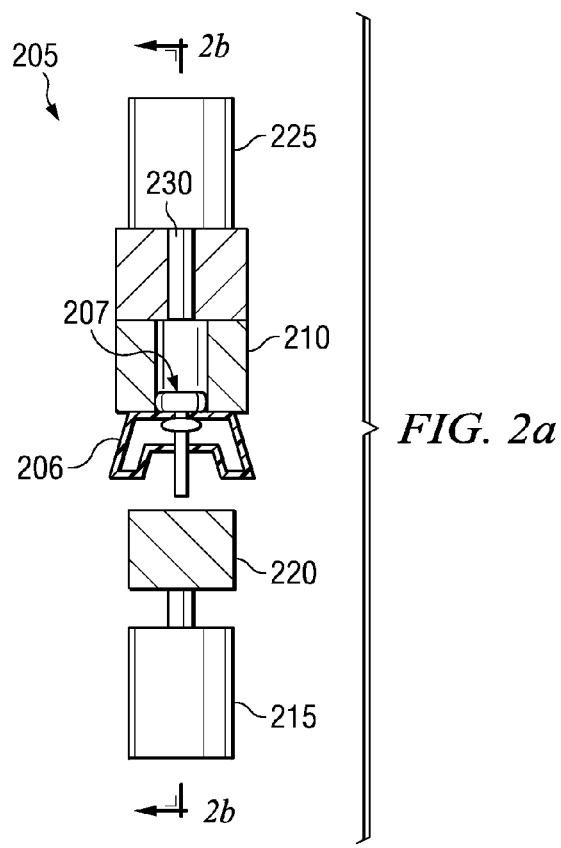
FIGS. 2a and 2b illustrate plan and side cross-sectional views of a mechanism to automatically extract a pin at one end of a plastic storage and shipping tube to permit the loading of the tube with packaged integrated circuit chips and then replace the extracted pin without requiring human intervention according to a preferred embodiment of the present invention.
Figure 2B:
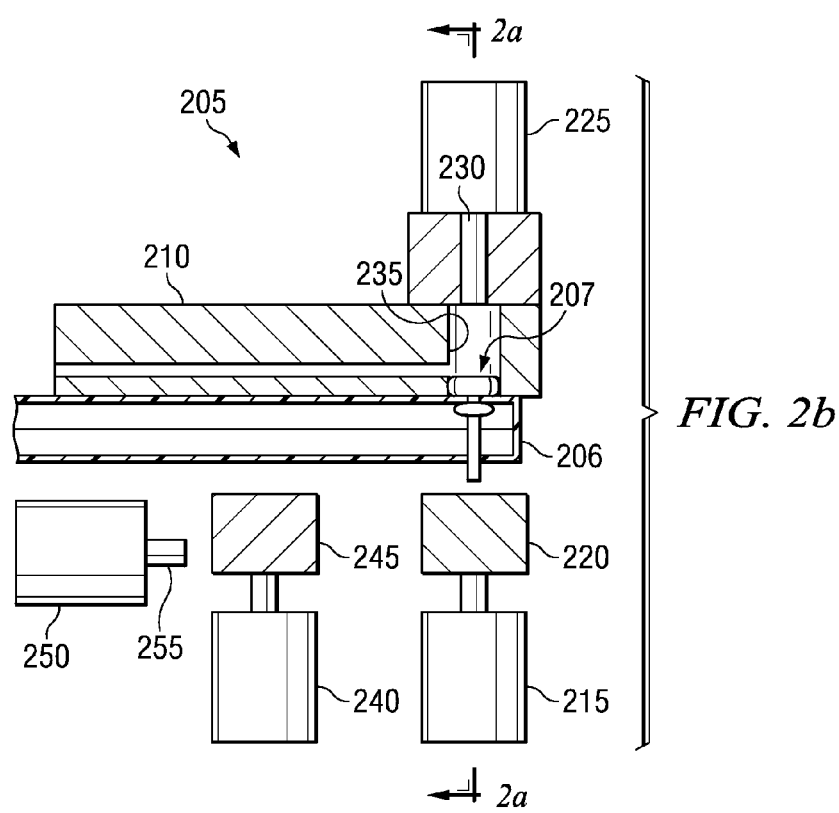

Referring now to FIGS. 2a and 2b, the diagrams illustrate plan and side cross-sectional views of a mechanism 205 that automatically extracts a pin, for example, pin 115 (FIG. 1a) at one end of a plastic tube, for example, plastic tube 105 (FIG. 1a), to permit the loading of ICs into the plastic tube, at an initial stage of an IC loading process according to a preferred embodiment of the present invention. Notice that FIG. 2a provides a side cross-sectional view of the mechanism 205 along a dashed line labeled A–A' in FIG. 2b and FIG. 2b provides a plan cross-sectional view of the mechanism 205 along a dashed line labeled B–B' in FIG. 2a.

According to a preferred embodiment of the present invention, the plastic tubes are loaded into a hopper or a conveyer belt (neither shown) and are automatically loaded into the mechanism 205. Once a plastic tube 206 is loaded into the machine, a first ram 245, which is moved by a first piston 240, is used to hold the plastic tube 206 in place. A second piston 215 and ram 220 combination is used to push a pin 207 from the plastic tube 206. A third piston 250 and ram 255 combination is used to hold piston 240 and ram 245 combination in a locked position in preparation for inserting the pin back into the tube 206 when the tube 206 is full. A fourth piston 225 and ram 230 combination is used to push the pin 207 back into position in the plastic tube 206 after the ICs are loaded into the plastic tube 206. An air chamber 235 in the mechanism 205 provides sufficient clearance for the pin 207 when it is pushed out of its original position. The air chamber 235 having holes on one side to permit the pin 207 to enter the air chamber 235 and on the opposite side to allow the third ram to enter the air chamber 235 and to push the pin 207 back into the plastic tube 206. According to a preferred embodiment of the present invention, it is preferred that the dimensions of the air chamber 235 be sufficiently large to hold the pin 207, but not so large that there is a great deal of space around the pin 207. This implies that the bore of the air chamber be slightly larger than the diameter of the pin 207. Note that FIGS. 2a and 2b illustrate the plan and side cross-sectional views of a first stage of the IC loading process where an empty plastic tube 206 is moved into position in the machine 205.

According to a preferred embodiment of the present invention, the second ram 220 is of sufficient width to push the pin 207 even if it is at one of several different positions along the plastic tube 206. The pin 207 may be at several different places (or preformed holes) along one end of the plastic tube 206 due to the different physical dimensions or the number of the ICs that may be loaded into the plastic tube 206. By having the second ram 220 of sufficient size, the mechanism 205 does not need to be reconfigured each time a different IC is being packed or a different number of ICs are being loaded into the plastic tubes. The width of the third ram 230 should also sufficient to push the pin 207 back into its original position. Additionally, according to a preferred embodiment of the present invention, the position of ram 230 along with chamber 235 at the end of the tube 206 can be easily adjusted with a single screw (or other adjustment mechanism) to be relocated under the current location of pin 207 along the end of the tube 206, depending on the quantity of units to be filled into the tube 206 and the location of the preformed hole to be used on tube 206. Additionally, the shape of the rams may vary depending upon the plastic tubes being loaded.

Figure 3A:
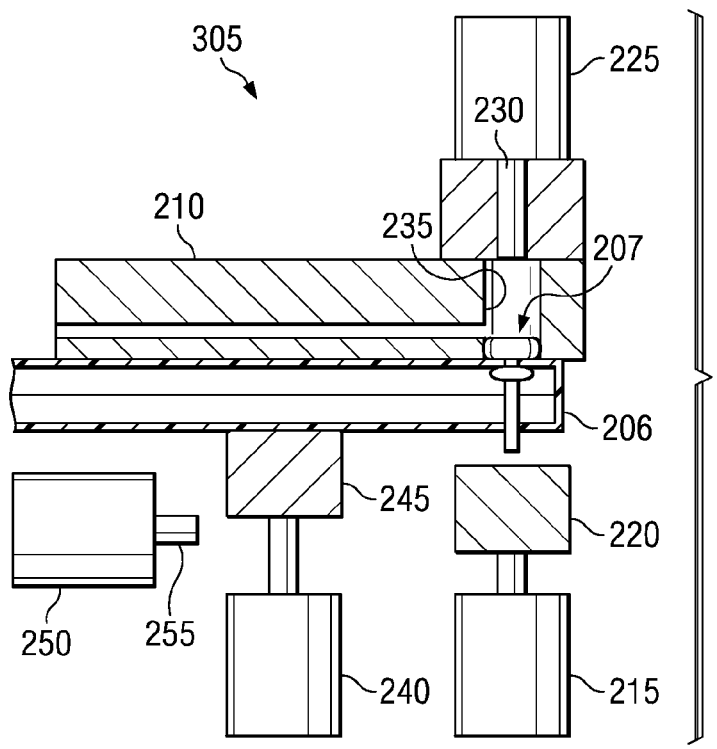
FIGS. 3a and 3b illustrate plan cross-sectional views of the mechanism of FIGS. 2a and 2b at steps two and three of the loading of packaged integrated circuit chips process according to a preferred embodiment of the present invention.
Figure 3B:
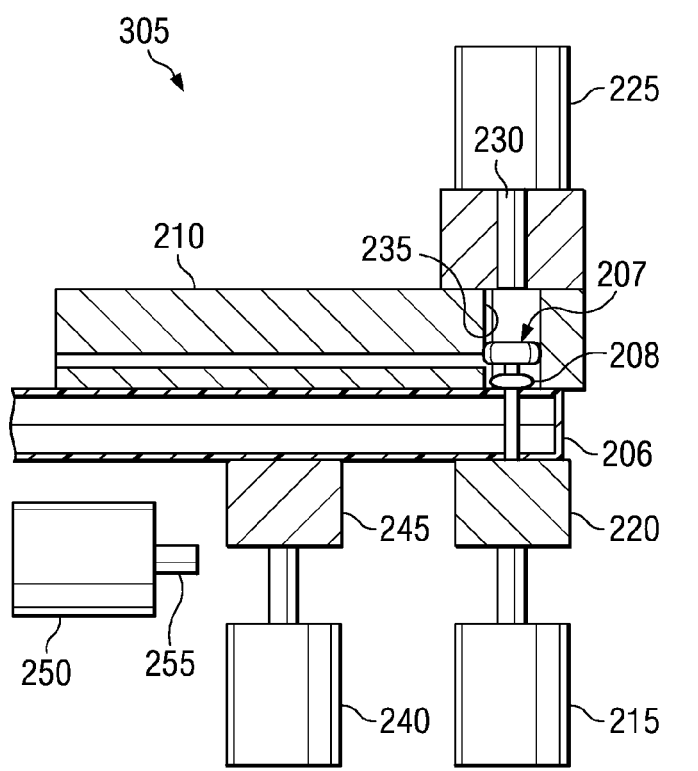

Referring now to FIGS. 3a and 3b, the diagrams illustrate a second and third stage of the IC loading process according to a preferred embodiment of the present invention. In FIG. 3a, the first ram 245 has been raised by the first piston 240 to firmly hold the plastic tube 206 in place (stage two) and in FIG. 3b, the second ram 220 (raised by the second piston 215) has pushed the pin 207 from its initial position in the plastic tube 206 (stage three). According to a preferred embodiment of the present invention, the pin 207 is pushed far enough out of the tube 206 so that a retention mechanism is pushed out of the tube 206. For example, in the pin 207 as displayed, there is a plastic bulb 208 that is used to hold the pin 207 inside the tube 206, and the pin 207 is pushed by the ram 220 sufficiently so that the plastic bulb 208 is clear of the tube 206. According to another preferred embodiment of the present invention, the retention mechanism may be a small ridge, a knob, a series of ridges, a series of knobs, or any other relatively simple physical feature of the pin to help it remain in place in the plastic tube.

According to a preferred embodiment of the present invention, the pin 207 is not pushed entirely out of the plastic tube 206, but is pushed sufficiently far from its initial position, so that the ICs have a free and unobstructed path into the plastic tube 206. By not pushing the pin 207 entirely out of the plastic tube 206, a portion of the pin 207 remains in the plastic tube 206 and proper alignment between the pin 207 and the plastic tube 206 is preserved. Should the pin 207 be pushed entirely out of the plastic tube 206, it is possible to lose alignment between the pin 207 and the plastic tube 206, thus making it more difficult to re-insert the pin 207 into its original position in the plastic tube 206. Even if alignment between the pin 207 and the plastic tube 206 can be maintained, it is a difficult task that can greatly increase the complexity of the mechanism 205.

Figure 4:
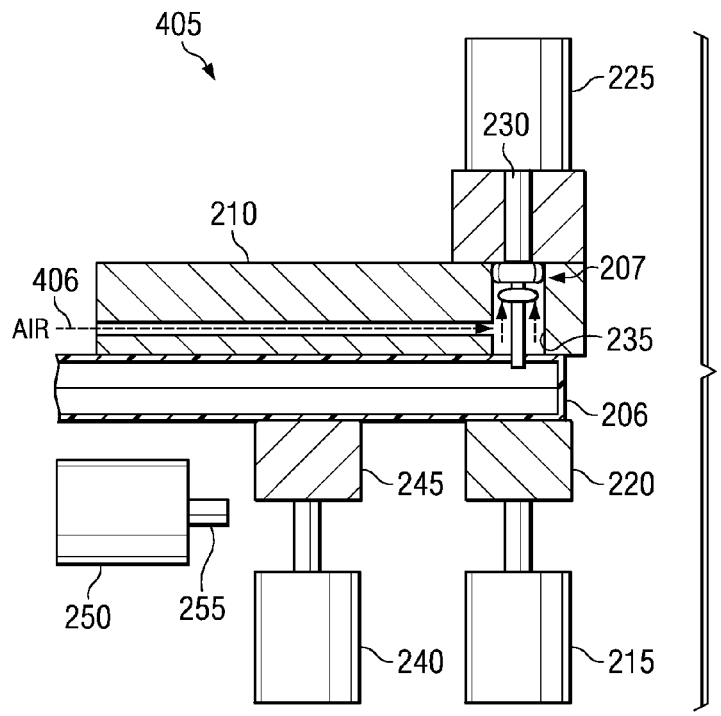
FIG. 4 illustrates a plan cross-sectional view of the mechanism of FIGS. 2a and 2b at step four of the loading of packaged integrated circuit chips process according to a preferred embodiment of the present invention.

Referring now to FIG. 4, the diagram illustrates a fourth stage of the IC loading process according to a preferred embodiment of the present invention. After the pin 207 has been pushed partially out of the plastic tube 206, a flow of air 406 is delivered to the chamber 235 at a sufficient pressure to hold the pin 207 against the effects of gravity. According to a preferred embodiment of the present invention, the flow of air 406 is continuous and continues for the duration of the time that the pin 207 is pushed out of the plastic tube 206. Additionally, the pressure of the air 406 is set so that it can support the weight of the pin 207 against the air chamber 235, which has a depth (or height) that is less than pin 207 is long. The limited depth of the air chamber 235 permits the lower end of the pin 207 to remain inside plastic tube 206. While the pin 207 is being held partially out of the plastic tube 206 by the flow of air 406, ICs (not shown) are loaded into the plastic tube 206.

According to a preferred embodiment of the present invention, the depth of the air chamber 235 is long enough so that the pin 207 can move far enough out of the plastic tube 206 so that the ICs can be loaded into the plastic tube 206, but not so deep that the pin 207 comes completely out of the plastic tube 206. According to another preferred embodiment of the present invention, there is a movable pin stop (not shown) inside the air chamber 206 that is used to limit the movement of the pin 207. The position of the movable pin stop is adjustable so that pins of varying length can be used. According to yet another preferred embodiment of the present invention, the ram 230 used to push the pin 207 back into the plastic tube 206 is set at a particular depth so that the ram 230 is used to limit the movement of the pin 207.

Figure 5:
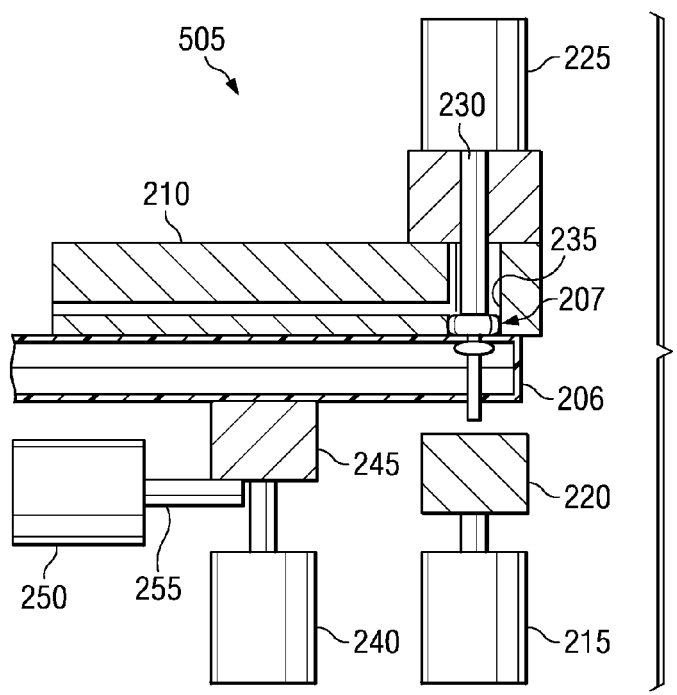
FIG. 5 illustrates a plan cross-sectional view of the mechanism of FIGS. 2a and 2b at step five of the loading of packaged integrated circuit chips process according to a preferred embodiment of the present invention.

Referring now to FIG. 5, the diagram illustrates a fifth stage of the IC loading process according to a preferred embodiment of the present invention. After a specified number of ICs (not shown) have been loaded into the plastic tube 206, the air flow 406 (FIG. 4) is stopped. With the air flow 406 stopped, the pin 207 drops into the plastic tube 206 hole but it is stopped from going fully into the plastic tube 206 by the retention mechanism (the plastic bulb 208 (FIG. 3b)). The pin 207 is now ready to be placed back into its original position in the plastic tube 206. The piston 250 and ram 255 combination is used to lock piston 240 and ram 245 combination in place as preparation for the final insertion stage. The ram 255 prevents the piston 240 and ram 245 combination from being lowered as a result of the insertion force applied by the third piston 225 and ram 235 combination. Should the piston 240 and ram 245 move while the pin 207 is being reinserted, the plastic tube 206 will move and the pin 207 will be inserted incorrectly. Then the third ram 230, driven by the third piston 225, pushes the pin 207 back into its original position in the plastic tube 206. Prior to the third ram 230 pushing the pin 207 back into its original position, the second ram 220 is lowered. The lowering of the second ram 220 permits the pin 207 to return to its original position. If the second ram 220 is not lowered, the pin 207 will not be able to return to its original position. Notice that the pin 207 was never pushed entirely out of the plastic tube 206. This eliminates the need to precisely re-aligning the pin 207 with its original position. The elimination of the precise alignment simplifies the design of the mechanism 205.

Figure 6:
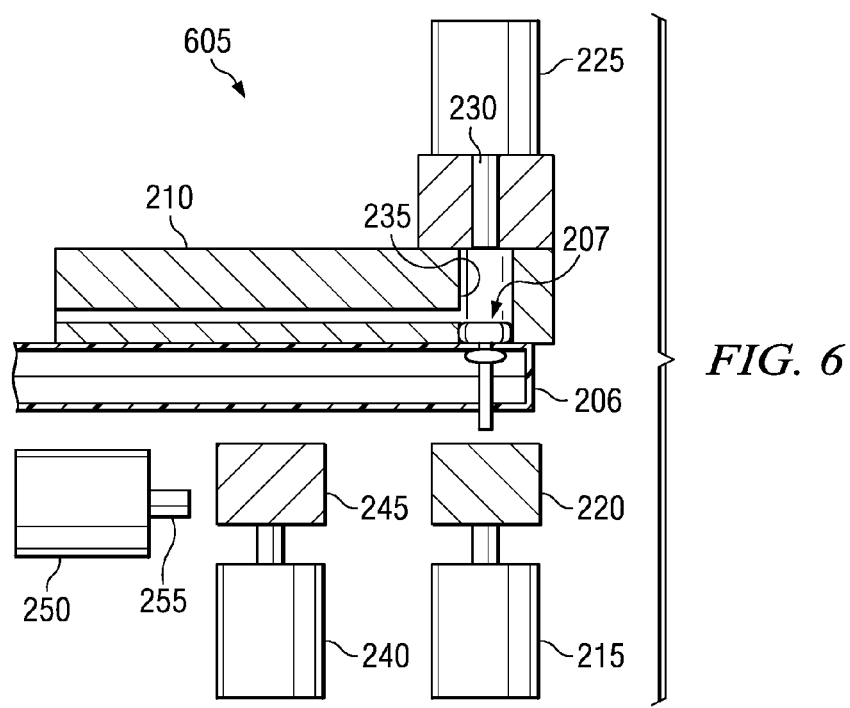
FIG. 6 illustrates a plan cross-sectional view of the mechanism of FIGS. 2a and 2b at step six of the loading of packaged integrated circuit chips process according to a preferred embodiment of the present invention.

Referring now to FIG. 6, the diagram illustrates a sixth stage of the IC loading process according to a preferred embodiment of the present invention. With the pin 207 pressed back into the plastic tube 206, the ICs (not shown) are locked inside the plastic tube 206. The plastic tube 206 is filled and is ready to be removed from the mechanism 205. The piston 250 and ram 255 combination return to their original location releasing ram 245. The first ram 245 lowers and the plastic tube 206 is free to move. After the plastic tube 206 is removed, another plastic tube is placed in the machine 205 and the IC loading process repeats.

According to a preferred embodiment of the present invention, the pistons 215, 225, 240 and 250 used to move the rams are pneumatic pistons. Other types of pistons can be used in place of the pneumatic pistons. For example, hydraulic pistons driven by hydraulic pressure may be used. Additionally, electromagnetic pistons driven by pulses or electricity can also be used.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for loading integrated circuits (IC) into a tube comprising:

providing an apparatus having an air chamber with an opening;

securing a tube, which has at one end a retention pin having a head and a tip, against the air chamber with the opening aligned to the retention pin;

partially pushing out the retention pin from the tube, and moving the head of the retention pin through the opening into the air chamber;

pressurizing the air chamber;

holding the retention pin in suspension in the air chamber with the pressure in the chamber;

inserting a number of ICs into the tube;

de-pressurizing the air chamber; and pushing the retention pin back into the tube.

2. The method of claim 1, further comprising using a retention pin stop to limit the movement of the retention pin in the air chamber.

3. The method of claim 2, wherein the retention pin stop is a top of the air chamber.

4. The method of claim 2, wherein the retention pin stop is a movable retention pin stop.

5. The method of claim 2, wherein the retention pin stop is a ram for pushing the retention pin back into the tube.

6. The method of claim 1, wherein the retention pin has a weight, and the depressurizing step reduces the pressure in the air chamber to below the weight of the retention pin.

7. The method of claim 1 further comprising the step of moving a third ram to securing the tube against the air chamber with the opening aligned to the retention pin.

8. The method of claim 1, wherein a first ram for performing the step of partially pushing out the retention pin from the tube and a second ram for performing the step of pushing the retention pin back into the tube are arranged opposite of each other, with the tube located between the two rams.

9. The method of claim 8, wherein the first and second rams are actuated by pneumatic pistons.

10. The method of claim 8, wherein the first and second rams are actuated by hydraulic pistons.

11. The method of claim 1, wherein the retention pin is partially pushed out of the tube only as far as necessary to permit resistance-free insertion of the ICs.

12. The method of claim 1, wherein the holding step begins after the retention pin has been partially pushed out of the tube.

13. The method of claim 1, wherein the holding step further comprise a step of directing pressurized air to the head end of the retention pin.

14. A method for unloading integrated circuits (IC) into a tube comprising:

providing an apparatus having an air chamber with an opening;

securing a tube, which has at one end a retention pin having a head and a tip, against the air chamber with the opening aligned to the retention pin;

partially pushing out the retention pin from the tube, and moving the head of the retention pin through the opening into the air chamber;

pressurizing the air chamber;

holding the retention pin in suspension in the air chamber with the pressure in the chamber;

removing a number of ICs from the tube;

de-pressurizing the air chamber; and pushing the retention pin back into the tube.

* * * * *